United States Patent [19]

Burstein

[11] Patent Number: 5,500,610
[45] Date of Patent: Mar. 19, 1996

[54] VERY HIGH CURRENT INTEGRATED CIRCUIT OUTPUT BUFFER WITH SHORT CIRCUIT PROTECTION AND REDUCED POWER BUS SPIKES

[75] Inventor: Steven Burstein, Smithtown, N.Y.

[73] Assignee: Standard Microsystems Corp., Hauppauge, N.Y.

[21] Appl. No.: 134,571

[22] Filed: Oct. 8, 1993

[51] Int. Cl.$^6$ ................................................. H03K 17/16
[52] U.S. Cl. ............................................... 326/85; 326/27
[58] Field of Search .......................... 307/443, 451, 307/263; 326/27, 85, 11

[56] References Cited

U.S. PATENT DOCUMENTS

| | | | |
|---|---|---|---|
| 4,731,553 | 3/1988 | Van Lehn et al. | 307/443 |
| 4,777,389 | 10/1988 | Wu et al. | 307/443 |
| 4,928,023 | 5/1990 | Marshall | 307/443 |
| 5,015,880 | 5/1991 | Drake | 307/263 |
| 5,036,222 | 7/1991 | Davis | 307/451 |
| 5,121,013 | 6/1992 | Chuang | 307/263 |
| 5,168,176 | 12/1992 | Wanlass | 307/443 |
| 5,315,172 | 5/1994 | Reddy | 307/263 |

Primary Examiner—Edward P. Westin
Assistant Examiner—Andrew Sanders
Attorney, Agent, or Firm—Meltzer, Lippe, Goldstein et al.

[57] ABSTRACT

An output buffer circuit for supplying a current to an output pad of an integrated circuit comprises an output driver circuit and a feedback circuit. The output driver circuit includes a first current supply element for supplying a small current to the output pad in response to an input logic signal. The feedback circuit includes a second current supply element for supplying a large current to the output pad and a circuit for generating a feedback voltage to control the second current supply element. The feedback voltage is responsive to the input logic signal and inversely follows the output pad voltage when the output pad voltage crosses a threshold. The output buffer provides excellent short circuit protection.

18 Claims, 9 Drawing Sheets

VERY HIGH CURRENT INTEGRATED CIRCUIT OUTPUT BUFFER WITH SHORT CIRCUIT PROTECTION AND REDUCED POWER BUS SPIKES

FIELD OF THE INVENTION

The present invention relates to an output buffer circuit in an integrated circuit for supplying a high current to an output load. The output buffer according to the invention reduces the probability of catastrophic damage to the integrated circuit caused by short circuiting the output of the output buffer to, e.g., a reference voltage which may be the supply voltage or ground, or to another output buffer circuit. The output buffer according to the invention also results in reduced power spikes.

BACKGROUND OF THE INVENTION

FIG. 1 shows a conventional output buffer circuit 20. The output buffer circuit 20 may be used in an integrated circuit for supplying a high current to an output load in response to an input logic signal voltage. The output buffer circuit 20 has a P-channel output driver circuit 21 and an N-channel output driver circuit 22. The P-channel output driver circuit 21 has a P-channel input 1 which receives a low voltage if the output buffer circuit 20 is to be driven to output a logic '1' and a high voltage otherwise. The N-channel output driver circuit 22 of the output buffer circuit 20 has an N-channel input 2 which receives a high voltage if the output buffer is to be driven to output a logic '0' and a low voltage otherwise. As is common in the art, the input signals at the P-channel input 1 and N-channel input 2 are controlled so they are not both active at the same time. Thus, it is common to use a logic circuit (not shown) for preventing the P-channel input from receiving a low voltage concurrently with the N-channel input receiving a high voltage. A high impedance output occurs when the P-channel input is high at the same time the N-channel input is low.

The voltage inputted on the P-channel input 1 is inverted by an inverter 3. The voltage outputted by the inverter 3 is inverted again by the inverter 4. The voltage outputted by the inverter 4 is fed to the gate input 6 of a P-MOS transistor 5. The source 7 of the transistor 5 is connected to a positive reference supply voltage Vdd and the drain 8 of the transistor 5 is connected to an output pad 9. ("Reference voltage" as used herein is synonymous with bias voltage, i.e., reference voltage means a voltage for biasing an active element so that it operates at a particular driving point of its output characteristics. Furthermore, "positive reference voltage" refers to a reference voltage which is more positive than a corresponding "negative reference voltage." It is understood that either reference voltage can be greater than, less than or equal to zero volts. Prefereably, the negative reference voltage is ground and the positive reference voltage is greater than zero.) When a low voltage is inputted on the P-channel input 1, the transistor 5 supplies the pad with a high current at a high value of the pad voltage, e.g., 5 volts. When a high voltage is inputted on the P-channel input 1, the transistor 5 conducts little or no current and presents a high impedance.

The voltage inputted on the N-channel input 2 is inverted by an inverter 10. The voltage outputted by the inverter 10 is inverted by the inverter 11. The voltage outputted from the inverter 11 is inputted to a gate 13 of an N-MOS transistor 12. The source 14 of the transistor 12 is connected to a negative reference voltage such as ground. The drain 15 of the transistor 12 is connected to the output pad 9. When a high voltage is inputted on the N-channel input 2, the transistor 12 supplies the output pad with a high current at a low value of the pad voltage, e.g., 0.4 volts. When a low voltage is inputted on the N-channel input 2, the transistor 12 conducts little or no current and presents a high impedance. In reality, while the P-channel current supply transistor 5 supplies a current to the pad 9, the N-channel current supply transistor 12 actually sinks a current from the pad 9. Both the supply of current by the P-channel transistor and the sinking of current by the N-channel transistor are referred to herein as supplying a current. (In other words supplying a current may refer to supplying a positive or negative current.)

There are two inverters (3 and 4) in the P-channel output driver circuit 21 and two inverters (10 and 11) in the N-channel output driver circuit 22 to provide a buffer between the logic circuit which supplies the input signals to the P-channel input 1 and N-channel input 2 and the current supply transistors 5 and 12. Specifically, it should be noted that the inverters 4 and 11 slow the turn on of the supply transistors 5 and 12 so that these transistors turn off faster than they turn on.

It is advantageous to increase the throughput of an integrated circuit which has one or more output buffer circuits. The throughput of an integrated circuit refers to the amount of data that flows through an integrated circuit. The output buffer circuits in an integrated circuit are desirably able to change from outputting a high voltage to a low voltage and vice versa at a high speed. Thus, in the output buffer circuit 20 of FIG. 1, the transistor 5 must shut off quickly and the transistor 12 must turn on quickly, when the input 1 to the P-channel driver circuit 21 changes from low to high and the input 2 to the N-channel driver circuit 22 changes from low to high. Likewise, the transistor 12 must shut off quickly and the transistor 5 must turn on quickly, when the input 2 to the N-channel driver circuit 22 changes from high to low and the input 1 to the P-channel driver circuit 21 changes from high to low. Furthermore, the throughput of an integrated circuit is also increased by increasing the number of bits outputted by the integrated circuit in parallel. Thus, a plurality of output buffer circuits such as shown in FIG. 1 must be provided in parallel for outputting the logic values of a corresponding plurality of bits.

The increasing throughput demands on output buffer circuits present a problem for conventional MOS output buffers. MOS transistors used in such output buffers, such as the transistors 5 and 12 of FIG. 1, primarily operate in the non-saturated region. In the non-saturated region, MOS transistors output a current which is related to their drain-source voltage. In order to sink a high current at 0.4 volts, the transistor 12 must have a large channel conductance. The transistor 12 may sink many times more current (e.g., ten times more) during the abrupt transition of the drain-source voltage from a high voltage of 5 volts to a low voltage of 0.4 volts, than during steady state operation at the low voltage of 0.4 volts. This is because the output pad 9 has a finite capacitance which is charged or discharged. The current outputted by the transistors 5 and 12 varies rapidly in time and develops a voltage (i.e. a large Ldi/dt) across the output lead inductances (i.e., bonding wire and packaging inductances) which in turn leads to noise, e.g., spikes, on the power supply bus. This may result in one or more erroneous logic values being outputted from the output buffer circuit 20.

This problem is compounded if several parallel output buffer circuits are provided. Typically, these output buffer circuits are each connected to the power supply via the same power supply bus. When operating in parallel, the noise produced by each output buffer connected to the same power supply bus tends to couple to other output buffers. Thus, noise produced by an abrupt change in the logic value outputted from one output buffer circuit can cause an erroneous logic value to be outputted from another output buffer circuit connected to the same power supply bus.

In addition to the noise problem, the output buffer circuit may be damaged if the output pad is short circuited. A huge current may be developed if the output pad is short circuited to a voltage supply or another output driver circuit when the transistor 5 or 12 begins supplying current during a transition of the output pad voltage. This huge current can cause catastrophic damage to the integrated circuit.

A number of prior art solutions have been proposed for reducing the effect of noise on the voltage outputted by the output buffer circuit. FIG. 2 shows a first prior art output buffer circuit 240 disclosed in U.S. Pat. No. 5,168,176 (Wanlass). In FIG. 2, lead inductances are shown as inductors L201 (connected to the negative reference voltage supply, e.g., ground), L202 (connected to the positive reference voltage supply $V_{dd}$), and L203 (connected to an output pad 210). The capacitance of the output pad 210 is shown as $C_L$. The Wanlass output buffer circuit 240 is provided with a P-MOS transistor P201 for supplying a current to the output pad 210 at a high pad voltage. A first N-MOS transistor N201 is provided for supplying a high sink current to the output pad 210 at a low pad voltage when a high input logic signal voltage appears on the input 220. A second N-MOS transistor N202 is provided in parallel to the first N-MOS transistor N201 for supplying a smaller sink current to the output pad 210 at a low pad voltage when a high input logic signal voltage appears on the input 220. A circuit is provided, such as the Schottky diode SD201, for controlling the flow of current in the first transistor N201. The Schottky diode SD201 permits the transistor N201 to supply its current to the output pad 210 only when the output pad voltage exceeds a certain threshold voltage above the low pad voltage. Thus, the Schottky diode SD201 permits the transistor N201 to supply its large sinking current initially to pull the output pad 210 from an initial high voltage to the threshold voltage. Thereafter, the Schottky diode SD201 blocks the transistor N201 from conducting any current unless the output pad voltage exceeds the threshold voltage. For example, if noise raises the output pad 210 voltage above the threshold, the Schottky diode SD201 once again permits the transistor N201 to supply its current to pull the output pad 210 voltage low.

The Wanlass output buffer circuit 240 does not provide short circuit protection. This is because both transistors N201 and N202 supply a current if the output pad 210 is at a high voltage. Thus, if a positive voltage supply were connected to the output pad 210 when a high voltage appears on the input 220, the transistor N201 may generate an extremely high current which can cause catastrophic damage to the integrated circuit containing the output buffer 240.

FIG. 3 shows another output buffer circuit 700 depicted in U.S. patent application Ser. No. 734,752, entitled "Apparatus and Method to Prevent the Disturbance of a Quiescent Output Buffer Caused by a Ground Bounce or by Power Bounce Induced by Neighboring Active Output Buffers" filed Jul. 23, 1991 for Frank Wanlass. This application is assigned to the assignee hereof. In FIG. 3, lead inductances are labeled L and the output capacitance is labeled $C_L$. The output buffer circuit 700 includes a P-channel circuit 701 for outputting a high pad voltage at the output pad 790 in response to receiving a logic low input logic signal voltage on the input 780. The P-channel circuit 701 includes the inverters 708 and 758, NOR gate 756, Schottky diode 706, and transistors 744 and 748, which are connected to noisy and quiet voltage supplies, respectively. The output buffer circuit 700 also includes an N-channel circuit 702 for outputting a low pad voltage at the output pad 790 in response to receiving a logic high input signal voltage on the input 780. The N-channel circuit 702 includes the inverters 709 and 754, the NAND gate 752, the Schottky diode 707 and the transistors 742 and 746. The transistors 742 is connected to a noisy ground. The transistor 746 is connected to a quiet ground. Both transistors 742 and 746 are capable of sinking a high current (e.g., 100 mA).

When a high voltage is inputted on the input 780, initially the transistor 746 is off and the transistor 742 is turned on by a control circuit such as the Schottky diode 707. The transistor 742 supplies a current to the output pad 790. This supplied current discharges the output capacitance $C_L$ to the noisy ground. When the voltage of the output pad 790 drops to a certain level, the Schottky diode 707 turns the transistor 742 off. Furthermore, when the voltage of the output pad 790 drops to this level, the inverters 709 and 754 and the NAND gate 752 turn the transistor 746 on. The transistor 746 then supplies a current to the output pad 790.

The circuit 700 does not provide any short circuit protection as only large transistors are used. Thus, if the output pad 790 is short circuited to a positive voltage supply when a high voltage appears on the input 790, the transistor 742 may supply an extremely high current which can damage the integrated circuit. Furthermore, the circuit 700 requires electrically isolated noisy and quiet grounds and voltage supplies. An additional consequence of providing isolated quiet and noisy ground and power supply nodes is that the transistors 742 and 746 ideally should not be on at the same time. If the transistors 742 and 746 were both on at the same time, noise would couple from the noisy power supply and ground nodes to the quiet power supply and ground nodes.

FIG. 4 depicts a prior art output buffer circuit 340 disclosed in U.S. Pat. No. 5,036,222 (Davis). In FIG. 4, an output enable signal is received at a serial connection of the inverters 318 and 320. The output of the inverter 320 is fed to a NAND gate 315 via an inverter 322 and to a NOR gate 316. An inputted logic signal voltage is received at the input Vin of a serial connection of the inverters 312 and 314. The output of the inverter 314 is inputted to the NAND gate 315 and the NOR gate 316. The output of the NOR gate 316 forms the N-channel input and the output of the NAND gate 315 forms the P-channel input.

The P-channel input is fed to a P-channel circuit 351 including the transistors P301, P302, P303, and N304 and the inverter 344. The P-channel circuit 351 outputs a current to the output pad 353 at a high output pad voltage Vout when a high input logic signal voltage is inputted at Vin. Likewise the N-channel input is fed to an N-channel circuit 352 including the transistors N301, N302, N303, and P304 and the inverter 342. The N-channel circuit 352 outputs a high current to the output pad 353 at a low output pad voltage Vout when a low input logic signal voltage is inputted at Vin.

In the N-channel circuit 352, the transistor N301 supplies the output pad with a smaller current than the transistor N303. When the voltage to be outputted at Vout from the output buffer circuit 340 is to be changed from high to low, the transistor N303 is initially off. The transistor N301 turns on and discharges the output capacitance of the output pad 353 by supplying a small sinking current. This causes the output pad voltage Vout to drop. When the output pad voltage Vout falls below the turn on voltage of the transistor P304, the transistor P304 turns on thereby turning on the transistor N303. The transistor N303 then supplies a current to the output pad Vout. The P-channel circuit 351 operates in a symmetrical fashion.

The disadvantage of the circuit 340 is that no short circuit protection is provided once the transistor N303 turns on. When the voltage at the output pad Vout drops to a certain level, the transistor P304 turns on and supplies a current which charges up the gate of the transistor N303. If the output pad Vout were to be subsequently short circuited to a positive voltage supply, the transistor P304 would turn off. However, the transistor N303 would remain on because of the charge stored at its gate. Thus, an extremely high current could flow through the transistor N303 which can damage the integrated circuit containing the output buffer circuit 340.

FIG. 5 shows yet another prior art output buffer circuit 440 disclosed in U.S. Pat. 4,777,389 (Wu). In FIG. 5, a voltage inputted at D is inverted by an inverter 416. The output of the inverter 416 is fed to a P-channel circuit 491. The P-channel circuit 491 outputs a high current to an output pad A at a high output pad voltage when a high input logic signal voltage is inputted at D. The P-channel circuit 491 includes inverters 418 and 420, NAND gate 413, NOR gate 412 and transistors N401, N404 and N405.

The output of the inverter 416 of FIG. 5 is also fed to an N-channel circuit 492. The N-channel circuit 492 outputs a high current to the output pad A at a low output pad voltage when a low input logic signal voltage is inputted at D. The N-channel circuit 492 includes the inverter 422, the NAND gate 417, the NOR gates 414 and 415 and the transistors N403, N406, N407, and N408.

In FIG. 5, both of the transistors N403 and N408 are for supplying the output A with a high current at a low pad voltage. When a low voltage appears at the input D, the NOR gate 414 outputs a high voltage after a delay caused by the inverters 416 and 422 and the NOR gate 414. Meanwhile, the combination of the initially high voltage of the output pad A and the high voltage outputted from the inverter 416 causes the AND gate 417 to turn on transistor N407. The output of the transistor N407 (initially) and the output of the NOR gate 414 (after a delay) cause the voltage at the gate of transistor N403 to rise slowly thereby slowly turning on the transistor N403. The transistor N403, in turn, slowly supplies current to the output pad A which causes the voltage at the output pad A to drop. When the voltage at the output pad A falls below a certain voltage, the NOR gate 415 abruptly changes from outputting a low voltage to outputting a high voltage. The high voltage outputted from the NOR gate 415 abruptly turns on the transistor N408 which supplies current to the output pad A.

A principle disadvantage of the output buffer circuit 440 of FIG. 5 lies in its complexity. In order to reduce noise on the output, four transistors and five logic circuits must be provided in the N-channel circuit. Thus, a large area is required for outputting each bit from the integrated circuit containing the circuit 440. Furthermore, some of the logic circuits used to control the transistors N403 and N408, i.e.,the two logic circuits 414 and 415, have more than two inputs. This makes it difficult to add additional modules with additional current supply elements and associated control circuitry.

FIG. 6 shows another prior art output buffer circuit 500 disclosed in U.S. Pat. No. 4,731,553 (Van Lehn). In FIG. 6, a P-channel circuit 591 is provided for supplying a high current to the output pad 510 at a high pad voltage in response to a low input logic signal voltage appearing on the input 505. The P-channel circuit 591 includes the NOR gates 502 and 518, the inverter 520 and the transistors 522 and 508. The inverter 520 includes two transistors 521a and 521b. An N-channel circuit 592 is also provided for supplying a high current to the output pad 510 at a low pad voltage in response to a high input logic signal voltage appearing on the input 505. The N-channel circuit 592 includes the inverters 504, 540, and 512, the NAND gates 528 and 506, the inverters 530 and 544 the resistors 516 and 526 and the transistors 514, 532, and 536. The inverter 530 includes the transistors 531a and 531b and the inverter 538 includes the transistors 542 and 544. The inverters 538 and 540, the transistors 534 and 536 and the NAND gate 506 form a switch circuit 590. The inverter 530 forms a delay circuit which turns on the transistor 532 in response to receiving a high voltage on the input 505 after a particular delay.

In FIG. 6, when a high voltage appears on the input 505, the transistor 514 connected to a noisy ground (DVss) initially turns on. This causes the voltage of the output pad 510 to drop. The switch circuit 590 turns off the transistor 514 when the voltage of the output 590 drops to a certain voltage level. In addition, in response to the high voltage appearing on the input 505, the delay circuit 530 turns on the transistor 532 which is connected to a quiet ground (CVss). The delay circuit 530 is designed to delay the turn on of the transistor 532 until the transistor 514 is off.

The biggest disadvantage of the output buffer circuit 500 is that no short circuit protection is provided. This is because both transistors 514 and 532 always turns on in response to the appropriate voltage appearing on the input 505 no matter how large the output pad voltage becomes. Thus, if the output pad 510 is short circuited to a positive voltage supply when a high voltage appears on the input 505, the transistors 514 and 532 may generate an extremely high current. In addition to this disadvantage, isolated noisy and quiet grounds must be provided in the output buffer circuit 500. As an additional consequence of providing separate noisy and quiet grounds, the transistors 532 and 514 cannot be on at the same time. The reason for this is that noise would otherwise couple between the noisy ground and the quiet ground.

FIG. 7 shows a further prior art output buffer circuit 602 disclosed in U.S. Pat. No. 4,928,023 (Marshall). An inputted logic signal voltage and an enable signal are received at a NAND gate 610. The inputted enable signal and output of the NAND gate 610 are received at a NAND gate 616. A P-channel circuit 691 is provided for supplying a high current to an output pad 615 at a high pad voltage value when a high input logic signal voltage appears on the input 605. The P-channel circuit 691 includes the inverter 612 and transistor 614. An N-channel circuit 692 is also provided for supplying a high current to the output pad 615 at a low pad voltage when a low input logic signal voltage appears on the input 605. Thus, the output buffer circuit 602 of F16 7 is non-inverting. The N-channel circuit 692 includes the inverter 618, the transistors 632 and 628, the drive circuit 630 and the switch circuit 640. The drive circuit 630 includes the transistors 620, 622, 624 and 626. The switch circuit 640 includes the transistors 634, 636, 638 and 642. The transistor 628 supplies a larger current than the transistor 632. Furthermore, the transistor 628 is connected to a noisy ground DVss and the transistor 632 is connected to a quiet ground CVss, which noisy and quiet grounds DVss and CVss are electrically isolated from each other.

When a low input logic signal voltage is received at the input 605, the drive circuit 630 causes the transistor 628 to turn on. The transistor 628 supplies a high current to the output pad 615 to discharge the output pad 615 to the noisy ground node DVss. This in turn causes the voltage of the output pad 615 to drop. As the voltage of the output pad 615 drops, the drive circuit 630 turns off the transistor 628. Furthermore, the drive circuit 630 causes the switch circuit 640 to turn on the transistor 632. The transistor 632 then supplies a small current at a low voltage to the output pad 615.

The Marshall output buffer 602 does not provide any short circuit protection as the high current supply transistor 628 is turned on initially to supply a high current to the output pad 615. Thus, if a positive voltage supply is connected to the output pad 615 while the transistor 628 is on, the transistor 628 may generate a huge current that can damage the integrated circuit. In addition, isolated noisy and quiet grounds must be provided in the output buffer circuit 602. As an additional consequence of requiring isolated noisy and quiet grounds, the transistors 628 and 632 cannot both be on at the same time.

In short, the above-described prior art output buffers are disadvantageous because they do not offer adequate short circuit protection. As mentioned above, if the output buffer is short circuited to a voltage supply or another output driver, the transistors of a prior art output buffer may supply an extremely high current. This can result in catastrophic damage to the integrated circuit. In addition, the above-described prior art output buffer circuits are extremely complex, i.e., they require complex control circuitry for controlling the elements which supply current for charging or discharging the output pad.

It is therefore an object of the present invention to provide an output buffer circuit which overcomes the disadvantages of the prior art.

SUMMARY OF THE INVENTION

In accordance with an illustrative embodiment of the invention, an output buffer circuit is provided for supplying a high current to an output pad of an integrated circuit. The output buffer circuit has an output driver circuit including a first current supply element. The first current supply element can supply a relatively small current to the output pad in response to an input logic signal voltage. The output buffer circuit also includes a feedback circuit. The feedback circuit has a second current supply element for supplying a second relatively large current to the output pad. The feedback circuit also includes a circuit for generating a feedback voltage in response to the input logic signal voltage and in response to the output pad voltage. The feedback voltage inversely follows the voltage of the output pad when the output pad voltage crosses a predetermined threshold. The feedback voltage turns on the second current supply element. As used herein the term current supply element refers to elements which supply current to the pad or sink current from the pad depending on whether the pad is being charged or discharged. In other words, the current supplied by the current supply element may be positive (supplying current) or negative (sinking current) depending on whether the pad is being charged or discharged.

The first and second current supply elements supply current to the output pad for driving the output pad to a particular reference voltage, i.e., a positive reference voltage or a negative reference voltage (e.g., ground). For example, the output driver circuit may be an N-channel output driver circuit for driving the output pad to the negative reference voltage in response to a high input logic signal voltage. In such a case, the feedback circuit is illustratively an N-channel feedback circuit for supplying a (negative) current to the output pad at a low output pad voltage in response to a high input logic signal voltage. Alternatively, the output driver circuit may be a P-channel output driver circuit for charging the output pad to the positive reference voltage in response to a low input logic signal voltage. In this case, the feedback circuit is illustratively a P-channel feedback circuit for supplying a current to the output pad at a high output pad voltage in response to a low input logic signal voltage. It is also possible to provide an output buffer circuit with an N-channel output driver circuit and an N-channel feedback circuit which respond to a high input logic signal voltage, and a P-channel output driver circuit and a P-channel feedback circuit which respond to a low input logic signal voltage.

In operation, in response to an appropriate input logic signal voltage, the first current supply element of the output driver circuit supplies a small current to the output pad. The second current supply element of the feedback circuit does not initially supply a current. The current supplied by the first current supply element changes the voltage of the pad towards the desired reference voltage. For example, as indicated above, if the output buffer circuit is an N-channel output buffer circuit, the first current supply element drives the voltage of the output pad towards the negative reference voltage. In such a case, as the output pad voltage decreases, it falls below a low threshold voltage. Alternatively, as indicated above, if the output buffer circuit is a P-channel output buffer circuit, the first current supply element drives the voltage at the output pad towards the positive reference voltage. In this case, as the output pad voltage increases, it exceeds a high threshold voltage. In either case, when the output pad voltage crosses the threshold, the feedback generation circuit outputs a feedback voltage which inversely follows the output pad voltage. This feedback voltage turns on the second current supply element which supplies a current inversely related to the magnitude of the feedback voltage. In other words, as the output pad voltage approaches the desired reference voltage, the second current supply element is turned on harder. The second current supply element supplies a large current which further changes the output pad voltage to the desired reference voltage.

Because the second current supply element does not output a current until the output pad voltage crosses a threshold, the output buffer circuit according to the present invention provides two advantages. First, voltage spikes on the power supply and ground nodes of the output buffer circuit are reduced. Such spikes result from a high current surge when the second current supply is initially turned on. This current surge is reduced because the voltage of the output pad is changed using the small current of the first current supply, prior to supplying the large current from the second current supply.

Second, the output buffer circuit provides short circuit protection. Suppose the output buffer circuit is an N-channel output buffer circuit for driving the output pad to a negative reference voltage. If the output pad is short circuited to a positive voltage supply, the output pad voltage will be held above, or will rise above, the threshold below which the feedback voltage generating circuit follows the output pad voltage. Alternatively, suppose the output buffer circuit is a P-channel output buffer circuit for driving the output pad to a positive reference voltage. If the output pad is short circuited to a negative voltage supply, the output pad voltage will be held below, or will fall below, the threshold above which the feedback voltage generating circuit follows the output pad voltage. In either case, the feedback generating circuit will shut off the second current supply element, if it is already on, or prevent the second current supplying element from turning on, if it is off. Because the second current supply element is off, the output buffer is incapable of generating a very high current which can damage the integrated circuit. Rather, only a small or medium current is generated by the first current supply element.

In short, an output buffer circuit is disclosed with a small current supplying element and a large current supplying element. A feedback voltage generating circuit which follows the output pad voltage when it crosses a predetermined threshold controls the large current supply element. Thus, an output buffer circuit is provided which reduces voltage spikes and provides short circuit protection.

DETAILED DESCRIPTION OF THE INVENTION

Figure 1:
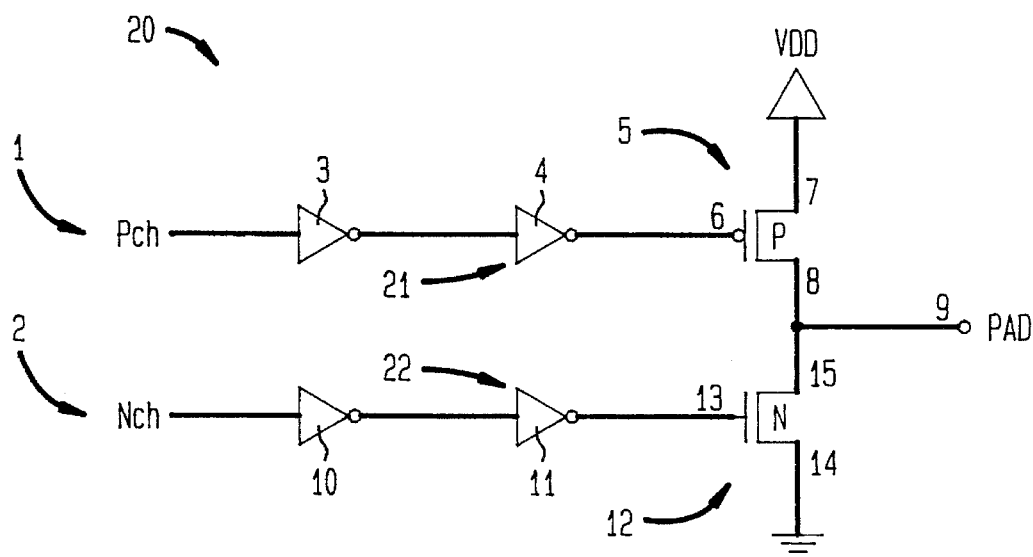
FIG. 1 depicts a prior art output buffer circuit.
Figure 2:
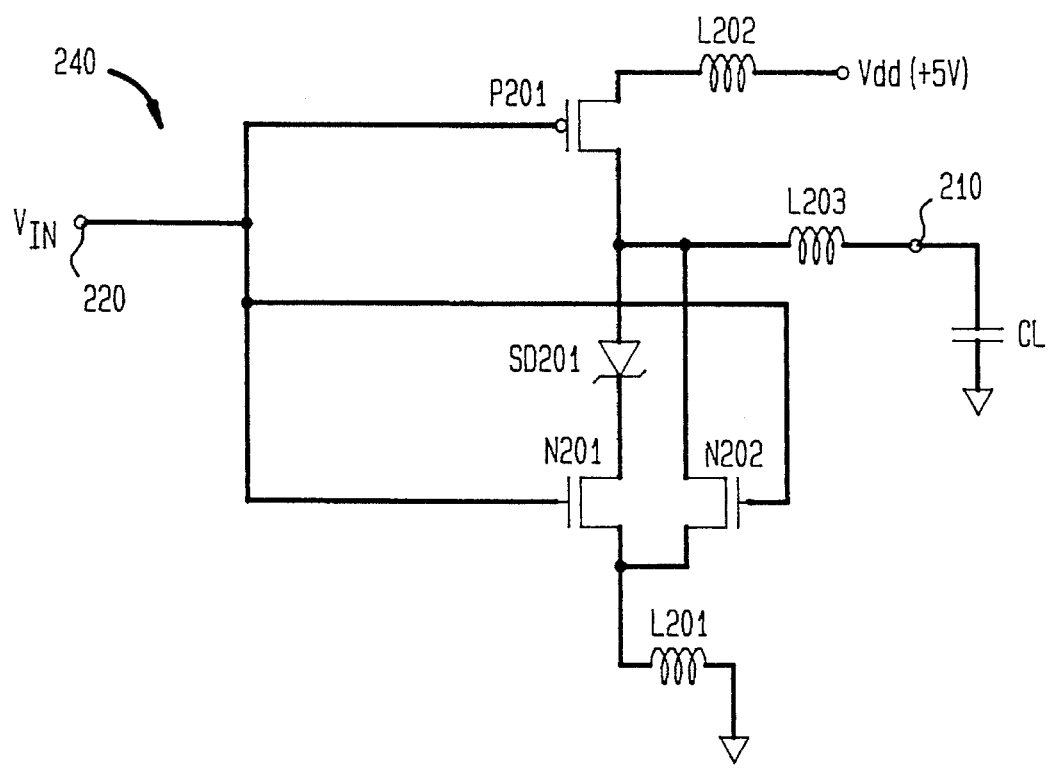
FIG. 2 depicts a first prior art output buffer circuit which reduces the effect of noise on the output.
Figure 3:
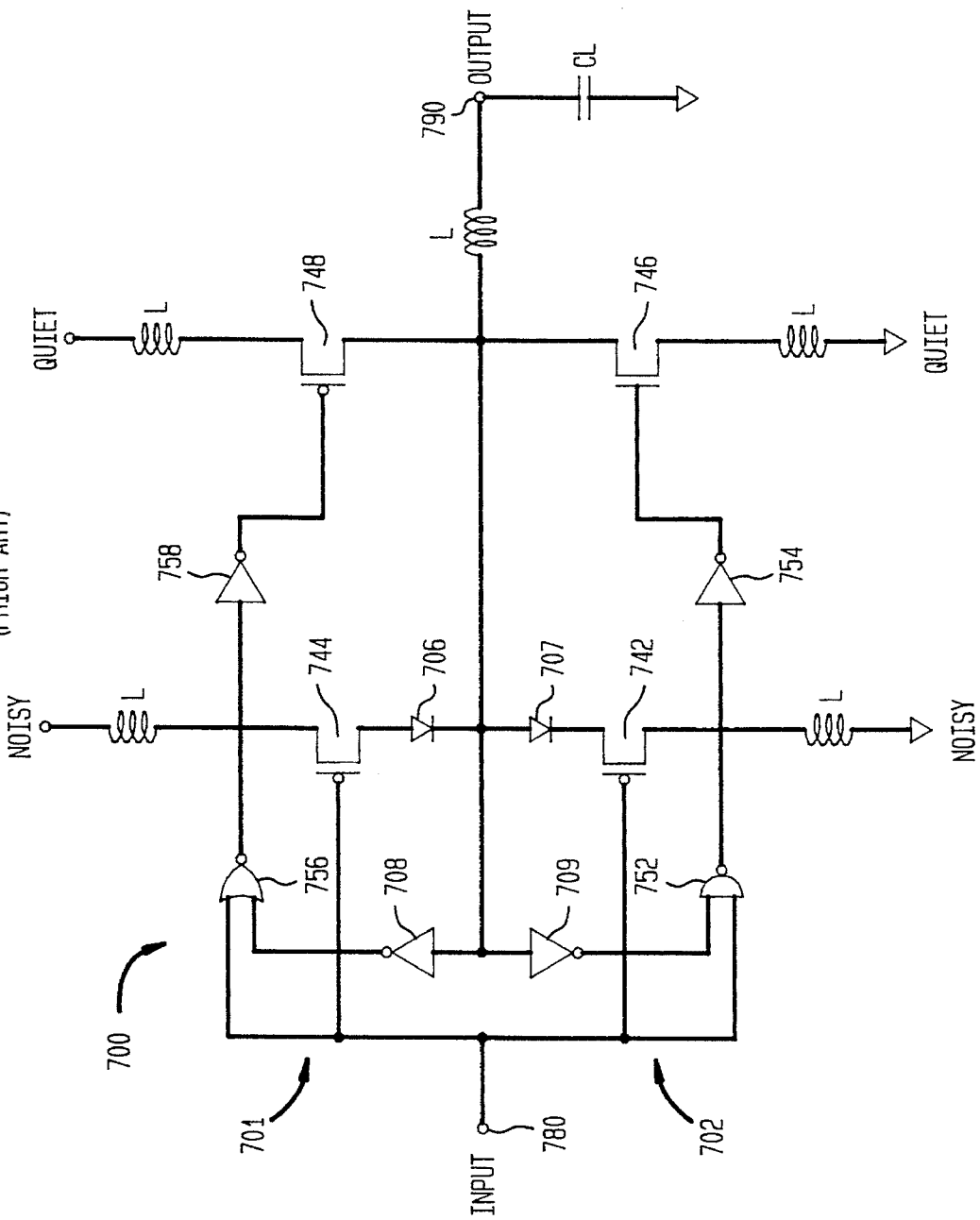
FIG. 3 depicts a second prior art output buffer circuit which reduces the effect of noise on the output.
Figure 4:
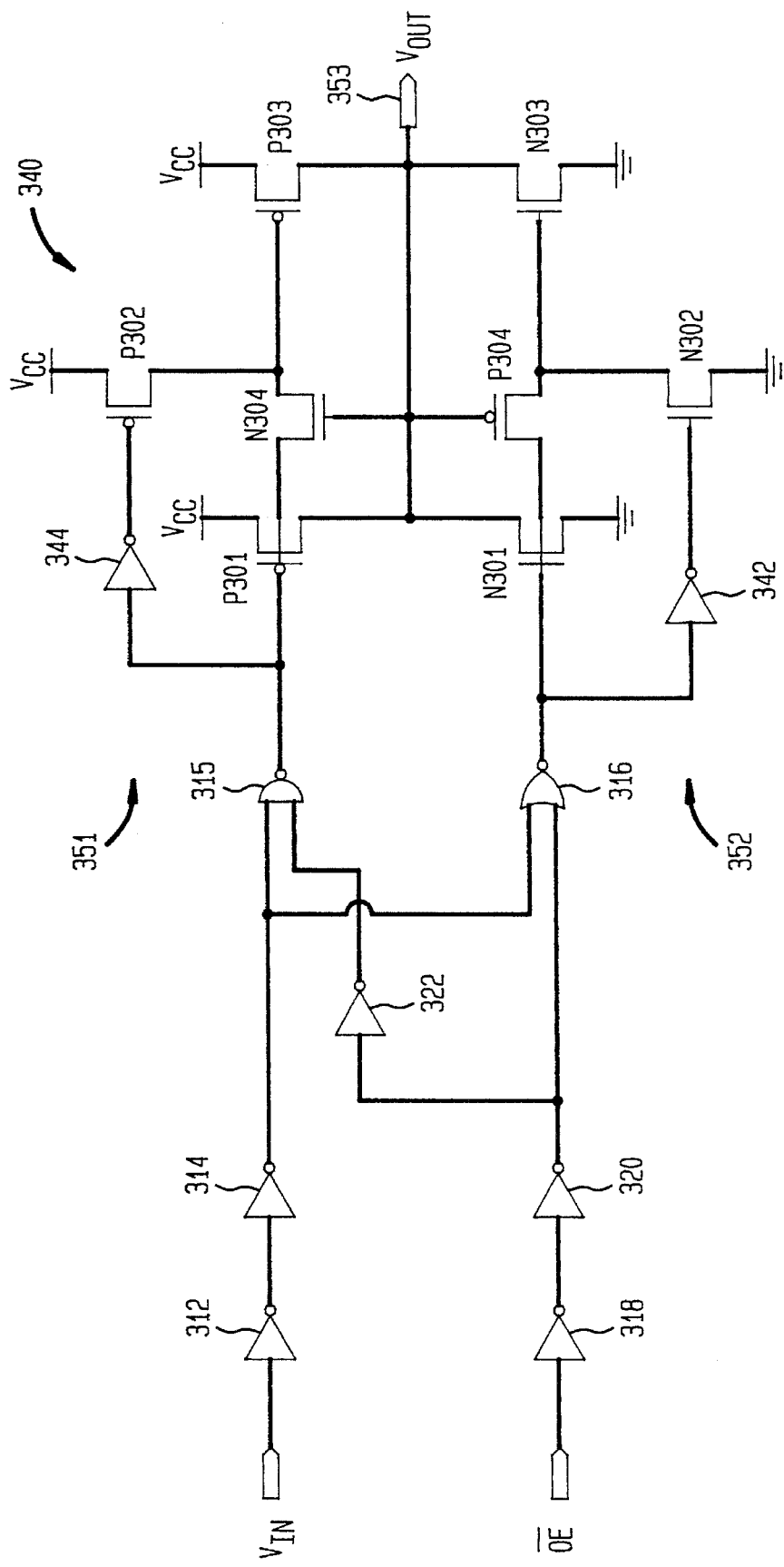
FIG. 4 depicts a third prior art output buffer circuit which reduces the effect of noise on the output.
Figure 5:
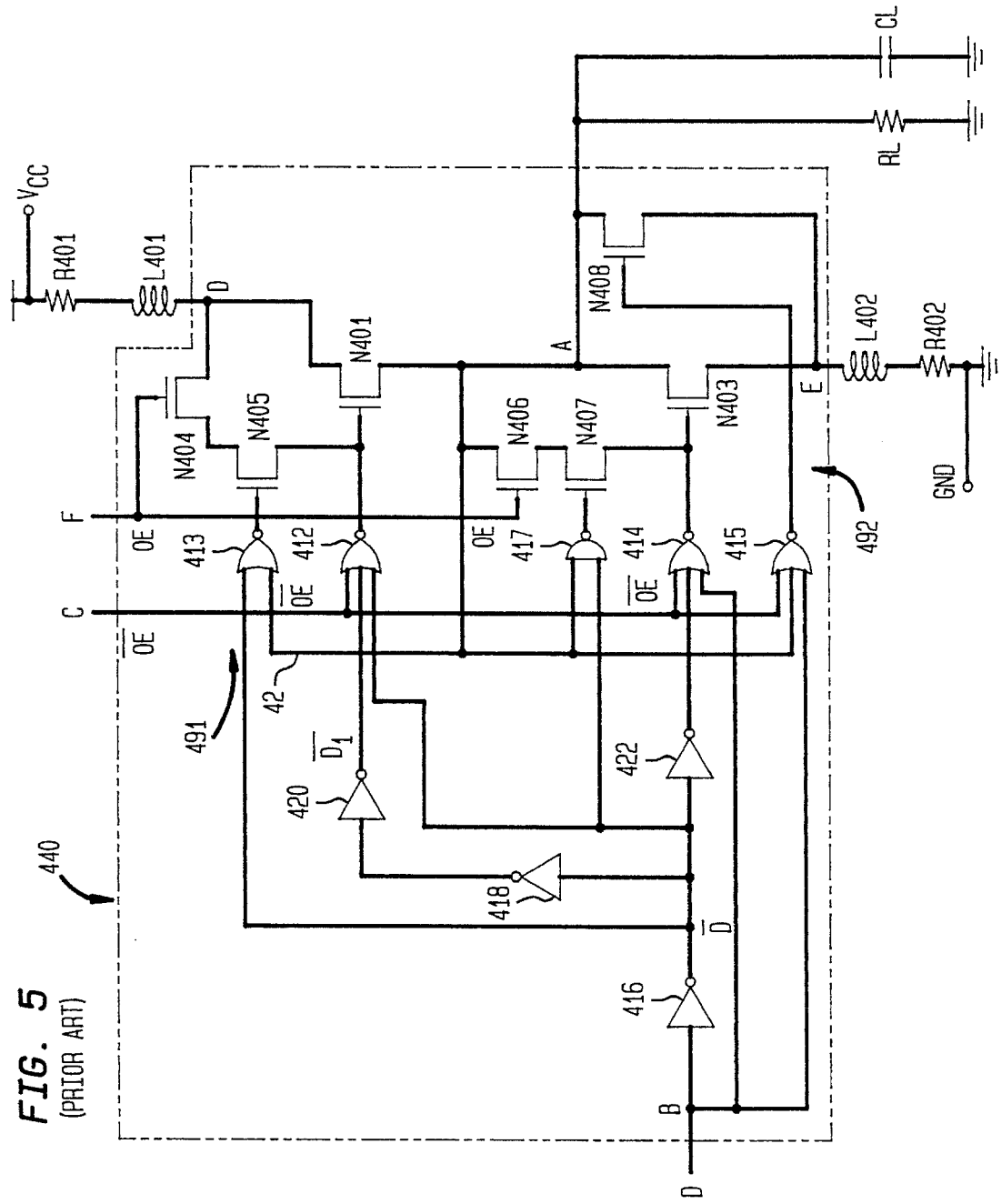
FIG. 5 depicts a fourth prior art output buffer circuit which reduces the effect of noise on the output.
Figure 6:
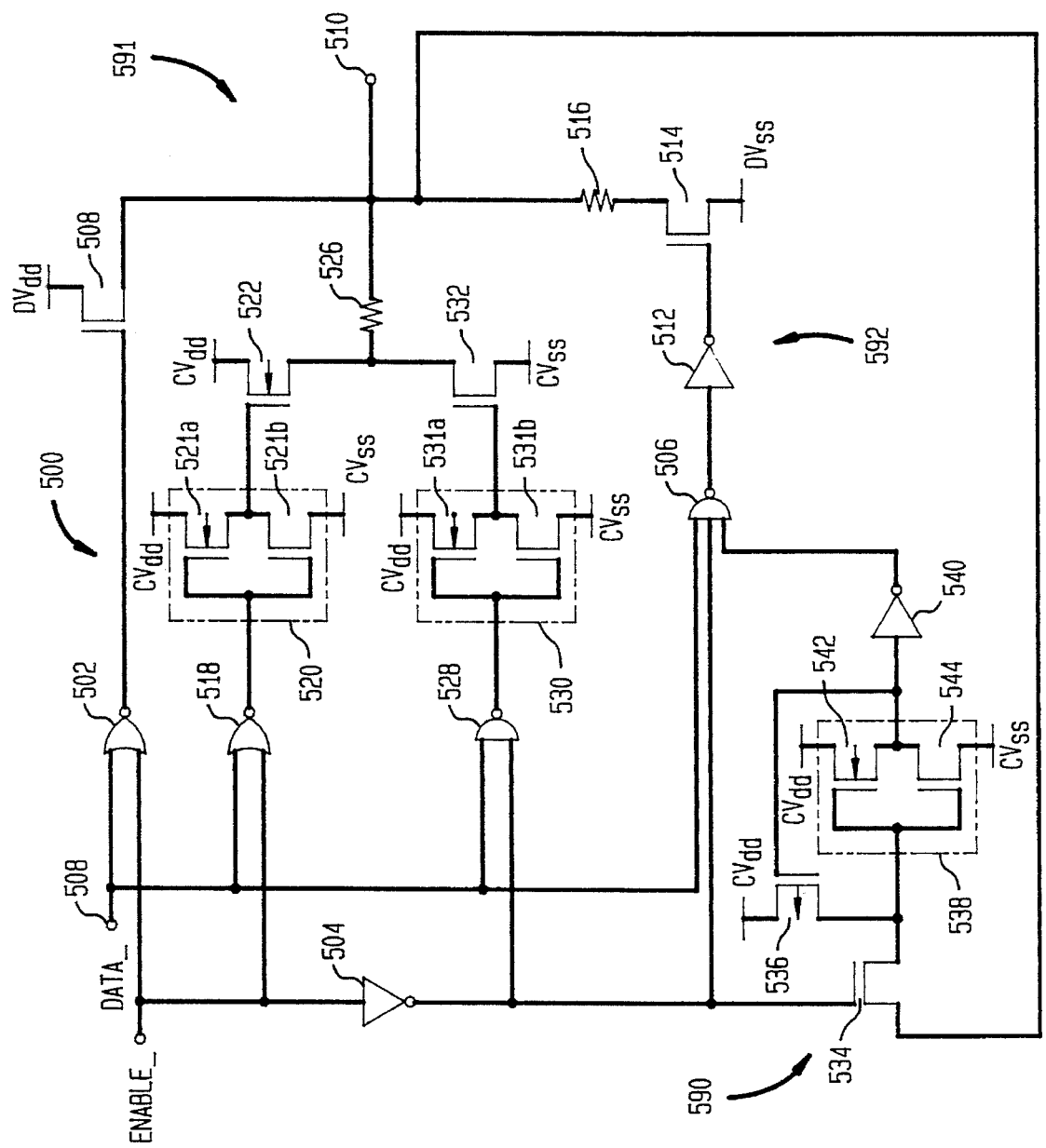
FIG. 6 depicts a fifth prior art output buffer circuit which reduces the effect of noise on the output.
Figure 7:
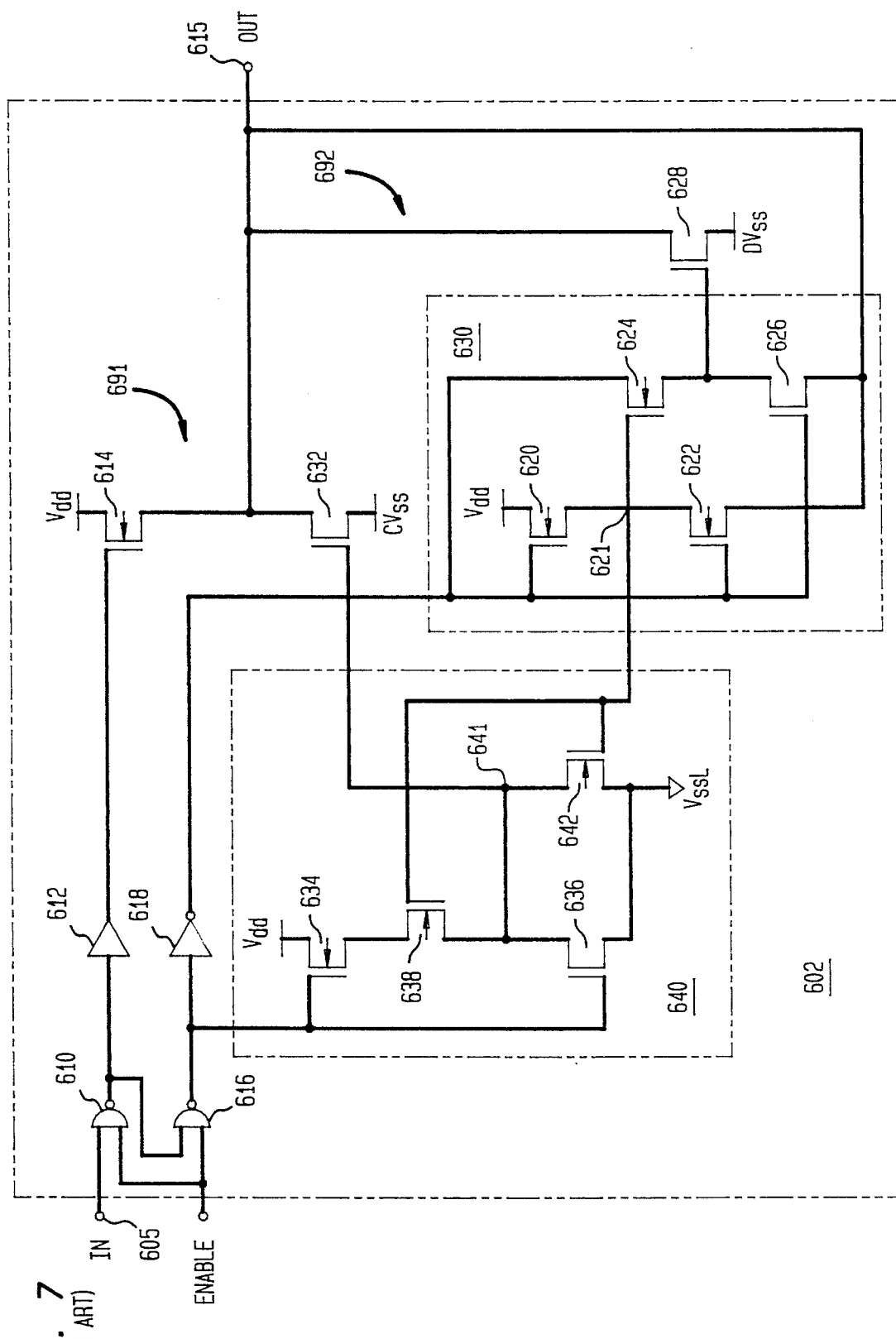
FIG. 7 depicts a sixth prior art output buffer circuit which reduces the effect of noise on the output.
Figure 8:
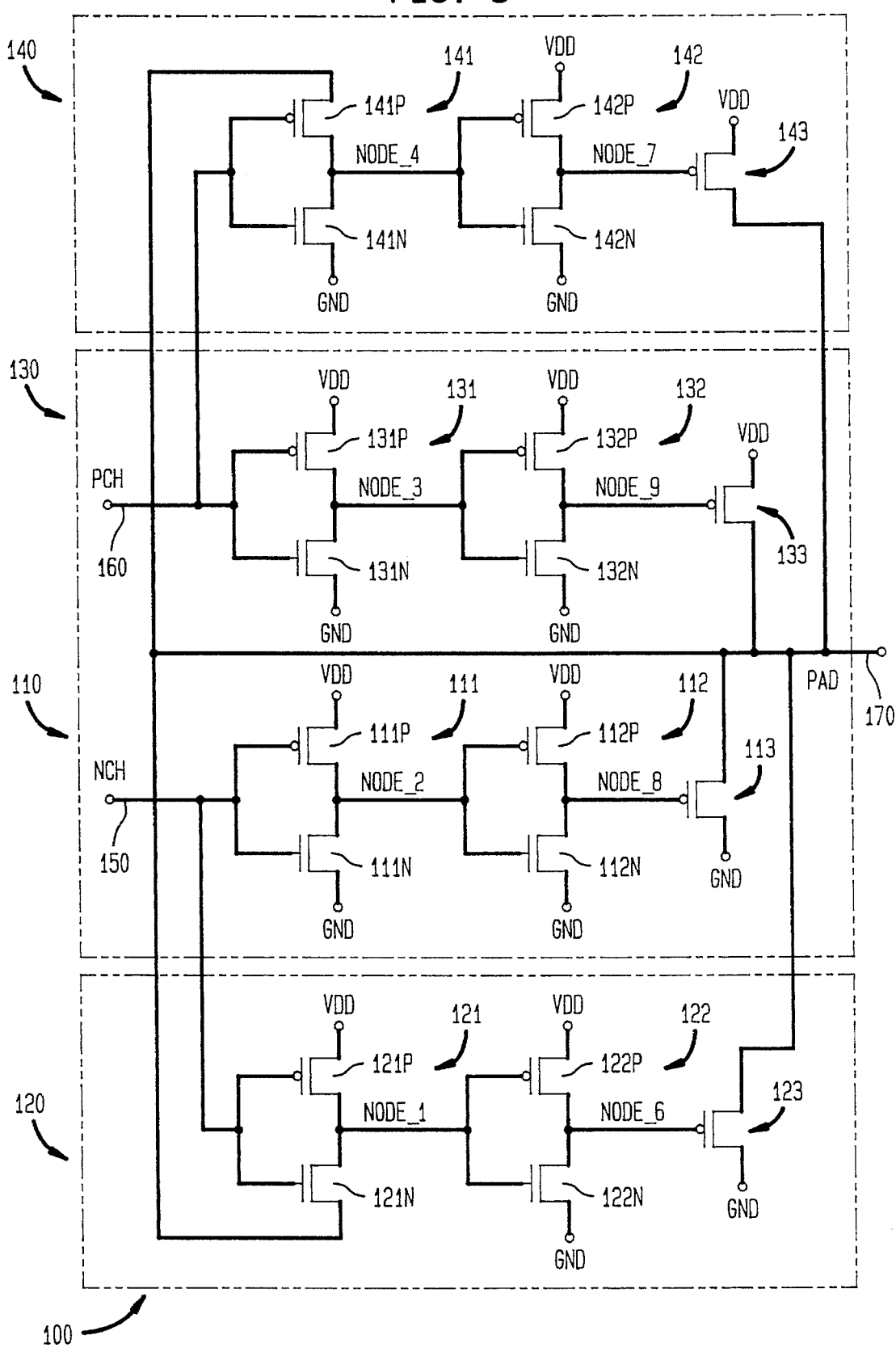
FIG. 8 depicts an output buffer circuit according to a first embodiment of the present invention.

FIG. 8 shows an output buffer circuit 100 according an illustrative embodiment of the present invention. The output buffer circuit 100 drives an output pad 170 with a voltage corresponding to a binary logic value of a single bit. As shown, the output buffer circuit 100 illustratively includes an N-channel output driver circuit 110 and an N-channel feedback circuit 120. Furthermore, the output buffer circuit 100 illustratively includes a P-channel output driver circuit 130 and a P-channel feedback circuit 140. Both the output driver circuit 110 and the feedback circuit 120 receive an input logic signal voltage on an N-channel input 150. Both the output driver circuit 130 and the feedback circuit 140 receive an input logic signal voltage on a P-channel input 160.

The N-channel output driver circuit 110 includes a first inverter 111. The first inverter 111 receives the input logic signal voltage on the N-channel input 150. Illustratively, the first inverter 111 is a CMOS inverter formed by connecting together the gates and drains of a P-MOS transistor 111P and an N-MOS transistor 111N. The source of the P-MOS transistor is connected to a supply voltage VDD which defines a high or positive reference voltage level. The source of the N-MOS transistor 111N is connected to a low or negative reference voltage level which may be ground.

The common gate connection of the transistors 111P and 111N serves as the input of the inverter 111 and the common drain connection of the transistors 111N and 111P serves as the output of the inverter 111. When a low voltage appears at the input of the inverter 111, the inverter 111 outputs a high voltage. When a high voltage appears at the input of the inverter 111, the inverter 111 outputs a low voltage.

The output of the inverter 111 is connected to the input of a second similar inverter 112. Illustratively, the second inverter 112 is a CMOS inverter formed by connecting together the gates and drains of a P-MOS transistor 112P and an N-MOS transistor 112N. The source of the P-MOS transistor 112P is connected to the supply voltage VDD. The source of the N-MOS transistor 112N is connected to the negative reference voltage which may be ground.

The common gate connection of the transistors 112P and 112N serves as the input of the inverter 112 and the common drain connection of the transistors 112N and 112P serves as the output of the inverter 112. When a low voltage appears at the input of the inverter 112, the inverter 112 outputs a high voltage. When a high voltage appears at the input of the inverter 112, the inverter 112 outputs a low voltage.

The output of the second inverter 112 is connected to a control input of a transistor 113. Illustratively, the transistor 113 is an N-MOS transistor. The transistor 113 receives the output of the second inverter 112 at its gate. The source of the transistor 113 is connected to the ground or negative reference voltage via a ground bus (not shown). The drain of the transistor 113 is connected to the output pad 170. The transistor 113 outputs a small current which is related to the voltage applied at its gate. This small current is in the range of 20–40% of the total specified output current of the buffer circuit at the low output voltage. The small current is chosen to be only large enough to discharge the capacitance of the output pad 170 within an acceptable amount of time. When a low voltage appears at the gate of the transistor 113, the transistor 113 conducts little or no current and presents a high impedance.

The N-channel feedback circuit 120 includes an active element in the form of an inverter 121. Illustratively, the inverter 121 is a CMOS inverter formed by connecting together the gates and drains of a P-MOS transistor 121P and an N-MOS transistor 121N. The source of the P-MOS transistor 121P is a first reference voltage input of the inverter 121 and is connected to the supply voltage VDD. The source of the N-MOS transistor 121N serves as a second reference voltage input of the inverter 121. The source of the transistor 121N is connected to the output pad 170.

The common gate connection of the transistors 121P and 121N serves as the input of the inverter 121 and the common drain connection of the transistors 121N and 121P serves as the output of the inverter 121. The input of the inverter 121 receives the input logic signal voltage on the N-channel input 150. When a low voltage appears at the input of the inverter 121, the inverter 121 outputs a high voltage. When a high voltage appears at the input of the inverter 121, the inverter 121 outputs a low voltage. Unlike the inverters 111 and 112 which receive the ground voltage as a negative reference voltage, the inverter 121 receives the output pad voltage as a negative reference voltage. Accordingly, when a high voltage appears at the input of the inverter 121, the inverter 121 outputs a voltage approximately equal to the output pad voltage. Thus, when a high voltage appears at the input of the inverter 121, the voltage outputted from the inverter 121 follows the voltage of the output pad 170.

The output of the inverter 121 is connected to the input of an inverter 122. Illustratively, the inverter 122 is a CMOS inverter formed by connecting together the gates and drains of a P-MOS transistor 122P and an N-MOS transistor 122N. The source of the P-MOS transistor 122P serves as a positive reference voltage input of the inverter 122 and is connected to VDD, e.g., via a power supply bus (not shown). The source of the N-MOS transistor 122N serves as a negative reference voltage input. The source of the transistor 122N receives an inputted negative reference voltage, e.g., ground via the ground bus.

The common gate connection of the transistors 122P and 122N serves as the input of the inverter 122 and the common drain connection of the transistors 122N and 122P serves as the output of the inverter 122. When a low voltage appears at the input of the inverter 122, the inverter 122 outputs a high voltage. When a high voltage appears at the input of the inverter 122, the inverter 122 outputs a low voltage. The transistors 122N and 122P are illustratively designed so that the inverter 122 does not output a high voltage until the input (i.e., the output pad) voltage drops below a certain predetermined threshold voltage $V_{te1}$. Thus, as the voltage inputted to the inverter 122 drops from a high voltage, the output of the inverter 122 remains at a low voltage until the inputted voltage crosses the threshold voltage $V_{te1}$. Once the input voltage crosses the threshold voltage $V_{te1}$, the inverter 122 operates in a transition region, i.e., the inverter 122 outputs a high voltage which increases as the inputted (i.e., the output pad) voltage decreases. To achieve this property, the inverter 122 is designed so that the N-MOS device 122N has a channel which is shorter and wider (or just wider) than the PMOS device 122P. This permits the inverter to switch in to the transition region at a voltage $V_{te1}$. The transition region is sometimes referred to as the linear region.

The output of the inverter 122 is connected to a control input of a transistor 123. Illustratively, the transistor 123 is an N-MOS transistor. The transistor 123 receives the output of the second inverter 122 at its gate. The source of the transistor 123 is connected to the negative reference voltage via the ground bus. The drain of the transistor 123 is connected to the output pad 170. The transistor 123 outputs a large current which is proportional to the voltage applied at its gate. This large current is in the range of 60–80% of the total specified output current of the buffer circuit at the low output voltage. When a low voltage appears at the gate of the transistor 123, the transistor 123 conducts little or no current and presents a high impedance.

The P-channel output driver circuit 130 includes a first inverter 131. The inverter 131 receives the input logic signal voltage on the P-channel input 160. Illustratively, the inverter 131 is a CMOS inverter formed by connecting together the gates and drains of a P-MOS transistor 131P and an N-MOS transistor 131N. The source of the P-MOS transistor 131P serves as a reference voltage input which is connected to the supply voltage VDD. The source of the N-MOS transistor 131N serves as a reference voltage input which is connected to ground.

The common gate connection of the transistors 131P and 131N serves as the input of the inverter 131 and the common drain connection of the transistors 131N and 131P serves as the output of the inverter 131. When a low voltage appears at the input of the inverter 131, the inverter 131 outputs a high voltage. When a high voltage appears at the input of the inverter 131, the inverter 131 outputs a low voltage.

The output of the inverter 131 is connected to the input of a second similar inverter 132. Illustratively, the second inverter 132 is a CMOS inverter formed by connecting together the gates and drains of a P-MOS transistor 132P and an N-MOS transistor 132N. The source of the transistor 132P is connected to the supply voltage VDD and the source of the transistor 132N is connected to ground.

The common gate connection of the transistors 132P and 132N serves as the input of the inverter 132 and the common drain connection of the transistors 132N and 132P serves as the output of the inverter 132. When a low voltage appears at the input of the inverter 132, the inverter 132 outputs a high voltage. When a high voltage appears at the input of the inverter 132, the inverter 132 outputs a low voltage.

The output of the second inverter 132 is connected to a control input of a transistor 133. Illustratively, the transistor 133 is a P-MOS transistor. The transistor 133 receives the output of the second inverter 132 at its gate. The source of the transistor 133 is connected to the supply voltage VDD via the power supply bus. The drain of the transistor 133 is connected to the output pad 170. The transistor 133 outputs a small current which is proportional to the voltage applied at its gate. This small current is in the range of 20–40% of the total specified output current of the buffer current at the high output voltage. The small current is chosen to be only large enough to charge the capacitance of the output pad 170 within an acceptable amount of time. When a high voltage appears at the gate of the transistor 133, the transistor 133 conducts little or no current and presents a high impedance.

The P-channel feedback circuit 140 includes an active element in the form of a first inverter 141. The inverter 141 receives the input logic signal voltage on the P-channel input 160. Illustratively, the inverter 141 is a CMOS inverter formed by connecting together the gates and drains of a P-MOS transistor 141P and an N-MOS transistor 141N. The source of the P-MOS transistor 121P serves an positive reference voltage input of the inverter 141. The source of the transistor 131P is connected to the output pad 170. The source of the N-MOS transistor 141N serves as a second reference voltage input. The source of the transistor 141N receives a negative reference voltage via the ground bus.

The common gate connection of the transistors 141P and 141N serves as the input of the inverter 141 and the common drain connection of the transistors 141N and 141P serves as the output of the inverter 141. When a low voltage appears at the input of the inverter 141, the inverter 141 outputs a high voltage. When a high voltage appears at the input of the inverter 141, the inverter 141 outputs a low voltage.

Unlike the inverters 131 and 132 which receive the supply voltage VDD as a positive reference voltage, the inverter 141 receives the output pad voltage as a positive reference voltage. Thus, when a low voltage appears at the input of the inverter 141, the inverter 141 outputs a voltage approximately equal to the output pad voltage. Accordingly, when a low voltage appears at the input of the inverter 141, the voltage outputted from the inverter 141 follows the voltage of the output pad 170.

The output of the inverter 141 is connected to the input of a second similar inverter 142. Illustratively, the inverter 142 is a CMOS inverter formed by connecting together the gates and drains of a P-MOS transistor 142P and an N-MOS transistor 142N. The source of the transistor 142P is connected to VDD and the source of the transistor 142N is connected to ground.

The common gate connection of the transistors 142P and 142N serves as the input of the inverter 142 and the common drain connection of the transistors 142N and 142P serves as the output of the inverter 142. When a low voltage appears at the input of the inverter 142, the inverter 142 outputs a high voltage. When a high voltage appears at the input of the inverter 142, the inverter 142 outputs a low voltage. The transistors 142N and 142P are illustratively designed so that the inverter 142 does not output a low voltage until the input (i.e., the output pad) voltage exceeds a certain predetermined threshold voltage $V_{te2}$. Thus, as the voltage inputted to the inverter 142 rises from a low voltage, the output of the inverter 142 remains at a high voltage until the inputted voltage crosses the threshold voltage $V_{te2}$. Once the input (i.e., the output pad) voltage crosses the threshold voltage $V_{te2}$, the inverter 142 operates in a transition region, i.e., the inverter 142 outputs a high voltage which decreases as the inputted voltage increases. The PMOS device 142P has a channel which is shorter and wider (or just wider) relative to the channel of the N-MOS device 142N to enable the inverter to enter the transition region at a voltage $V_{te2}$.

The output of the second inverter 142 is connected to a control input of a transistor 143. Illustratively, the transistor 143 is a P-MOS transistor. The transistor 143 receives the output of the second inverter 142 at its gate. The source of the transistor 143 is connected to the negative reference voltage via the ground bus. The drain of the transistor 143 is connected to the output pad 170. The transistor 143 outputs a large current which is inversely proportional to the voltage applied at its gate. This large current is in the range of 60–80% the specified output current of the buffer circuit at the high output voltage. When a high voltage appears at the gate of the transistor 143, the transistor 143 outputs little or no current. Instead the transistor 143 presents a high impedance.

The operation of the output buffer 100 is now discussed. The signals at the N-channel input 150 and the P-channel input 160 are controlled so that both channels are not active at the same time. It is common to use a logic circuit (not shown) for preventing the P-channel input 160 from receiving a low voltage concurrently with the N-channel input receiving a high voltage. Suppose the output pad is initially at a low voltage and a low input logic signal voltage is inputted on the N-channel input 150. The low input logic signal voltage is received at the inverter 111 in the N-channel output driver circuit 110. In response, the inverter 111 outputs a high voltage at node 2. This high voltage at node 2 is inputted to the inverter 112 which outputs a low voltage at node 8. The low voltage at node 8 is received at the gate of transistor 113 which turns off. Thus, the transistor 113 is placed in a high impedance state.

In response to receiving the low voltage input logic signal, the inverter 121 in the N-channel feedback circuit 120 outputs a high voltage on node 1. The inverter 122 receives the high voltage on node 1 and outputs a low voltage on node 6. The low voltage on node 6 is received at the transistor 123 which turns off.

Now suppose that the output pad 170 is initially at a high voltage and a high input logic signal voltage is inputted on the N-channel input 150. The high input logic signal voltage is received at the inverter 111 in the N-channel output driver circuit 110 which outputs a low voltage on node 2. The inverter 112 receives the low voltage on node 2 and outputs a high voltage on node 8. The transistor 113 receives the high voltage and turns on. The transistor 113 supplies a small current which discharges the capacitance of the output pad 170. As a result, the voltage of the output pad 170 drops from its initial high voltage towards the negative reference voltage, i.e., towards ground.

Meanwhile, the high input logic signal voltage is also received at the inverter 121. In response, the inverter 121 outputs on the node 1 of FIG. 8 a voltage which approximately equals the voltage of the output pad 170. However, the initial voltage of the output pad is above the threshold voltage $V_{te1}$. Thus, the inverter 122 continues to output a low voltage to the transistor 123. As a result, the transistor 123 initially remains off and does not supply a current to the output pad 170.

As the transistor 113 supplies the small current, the voltage of the output pad drops. Eventually, the voltage of the output pad falls below the threshold $V_{te1}$. When the voltage of the output pad 170 falls below the threshold voltage $V_{te1}$, the voltage at the node 1 falls below the threshold voltage $V_{te1}$. As a result, the inverter 122 outputs a high voltage on the node 6. The high voltage on the node 6 is received at the transistor 123, which turns on. Thus, the transistor 123 supplies a high current to the output pad 170 which further drives the voltage on output pad 170 to the negative reference voltage.

Once the voltage on the output pad 170 falls below the threshold voltage $V_{te1}$, the voltage outputted by the inverter 122 on node 6 inversely follows the voltage on the output pad 170. In other words, as the output pad voltage decreases, the voltage on node 6 increases. Thus, as the voltage of the output pad 170 decreases below the threshold voltage $V_{te1}$, the inverter 122 turns the transistor 123 on harder. Because the transistor 123 supplies a larger current than the transistor 113, the transistor 123 supplants the transistor 113 as the primary supply of current to the output pad 170.

Suppose that at the time a high input logic signal voltage is present on the N-channel input 150, the output pad 170 is short circuited to a high voltage source. In this case, the voltage of the output pad 170 is held at a high voltage, if the output pad voltage was initially high prior to the short circuit, or rises to the high voltage, if the output pad voltage was initially low prior to the short circuit. As mentioned above, by virtue of the connection of the output pad 170 to the reference voltage input of the inverter 121, the voltage outputted from the inverter 121 on the node 1 follows the output pad voltage. As a result, the voltage at the node 1 rises to the high voltage. Because the high voltage on the node 1 is above the threshold voltage $V_{te1}$ of the inverter 122, the inverter 122 outputs a low voltage at the node 6. Thus, the transistor 123 cuts off, if the transistor 123 was initially on prior to the short circuit, or is held off, if the transistor 123 was initially off prior to the short circuit. As such, only the transistor 113 turns on or remains on while the short circuit exists. Because the transistor 113 is designed to only supply enough current to discharge the output of the output pad 170, the transistor 113 only supplies a medium current of approximately 25 mA. This medium current is not sufficiently large to cause catastrophic damage to the integrated circuit containing the output buffer circuit 100.

This manner of operation is advantageous as the transistor 123 might otherwise generate a huge current which could damage the integrated circuit. Furthermore, the inverter 122 continually controls the transistor 123 to protect the integrated circuit against short circuit damage. Thus, regardless of whether the short circuit occurs prior to the transistor 123 turning on or afterwards, the inverter 122 shuts off the transistor 123 in the event of a short circuit.

Suppose the output pad is initially at a high voltage and a high input logic signal voltage is inputted on the P-channel input 160. The high input logic signal voltage is received at the inverter 131 of the P-channel output driver circuit 130. In response, the inverter 131 outputs a low voltage at node 3. This low voltage at node 3 is inputted to the inverter 132 which outputs a high voltage at node 9. The high voltage at node 9 is received at the gate of transistor 133 which turns off. Thus, the transistor 133 is placed in a high impedance state.

In response to receiving the high input logic signal voltage, the inverter 141 in the P-channel feedback circuit 140 outputs a low voltage on node 4. The inverter 142 receives the low voltage on node 4 and outputs a high voltage on node 7. The high voltage on node 7 is received at the transistor 143 which turns off.

Now suppose that the output pad 170 is initially at a low voltage and a low input logic signal voltage is inputted on the P-channel input 160. The low input logic signal voltage is received at the inverter 131 which outputs a high voltage on node 3. The inverter 132 receives the high voltage on node 3 and outputs a low voltage on node 9. The transistor 133 receives the low voltage and turns on. The transistor 133 supplies a small current which charges the capacitance of the output pad 170. As a result, the voltage of the output pad 170 rises from its initial low voltage towards the positive reference voltage, i.e., towards VDD.

Meanwhile, the low input logic signal voltage is received at the inverter 141. In response, the inverter 141 outputs on the node 4 of FIG. 8 a voltage which approximately equals the voltage of the output pad 170. However, the initial voltage of the output pad is below the threshold voltage $V_{te2}$. Thus, the inverter 142 continues to output a high voltage to the transistor 143. As a result, the transistor 143 initially remains off and does not supply a current to the output pad 170.

As the transistor 133 supplies the small current, the voltage of the output pad rises. Eventually, the voltage of the output pad exceeds the threshold $V_{te2}$. When the voltage of the output pad 170 is above the threshold voltage $V_{te2}$, the voltage at the node 4 is above the threshold voltage $V_{te2}$. As a result, the inverter 142 outputs a low voltage on the node 7. The low voltage on the node 7 is received at the transistor 143 which turns on. Thus, the transistor 143 supplies a high current to the output pad 170 which further drives the voltage on output pad 170 to the positive reference voltage.

Once the voltage on the output pad 170 exceeds the threshold voltage $V_{te2}$, the voltage outputted by the inverter 142 on node 7 inversely follows the voltage on the output pad 170. In other words, as the output pad voltage increases, the voltage on node 7 proportionally decreases. Thus, as the voltage of the output pad 170 increases above the threshold voltage $V_{te2}$, the inverter 142 turns the transistor 143 on harder. Because the transistor 143 supplies a higher current than the transistor 133, the transistor 143 supplants the transistor 133 as the primary supply of current to the output pad 170.

Suppose that at the time a low input logic signal voltage is present on the P-channel input 160, the output pad 170 is short circuited to a low voltage source. In this case, the voltage of the output pad 170 is held at a low voltage, if the output pad voltage was initially low prior to the short circuit, or falls to the low voltage, if the output pad voltage was initially high prior to the short circuit. As mentioned above, by virtue of the connection of the output pad 170 to the positive reference voltage input of the inverter 141, the voltage outputted from the inverter 141 on the node 4 follows the output pad voltage. As a result, the voltage at the node 4 falls to the low voltage. Because the low voltage on the node 4 is below the threshold voltage $V_{te2}$ of the inverter 142, the inverter 142 outputs a high voltage at the node 7. Thus, the transistor 143 cuts off, if the transistor 143 was initially on prior to the short circuit, or is held off, if the transistor 143 was initially off prior to the short circuit. As a result, only the transistor 133 is on. Because the transistor 133 is designed to only supply enough current to charge the output of the output pad 170, the transistor 133 only supplies a medium current of approximately 15 mA. This medium current is not sufficiently large to cause catastrophic damage to the integrated circuit containing the output buffer circuit 100.

Figure 9:
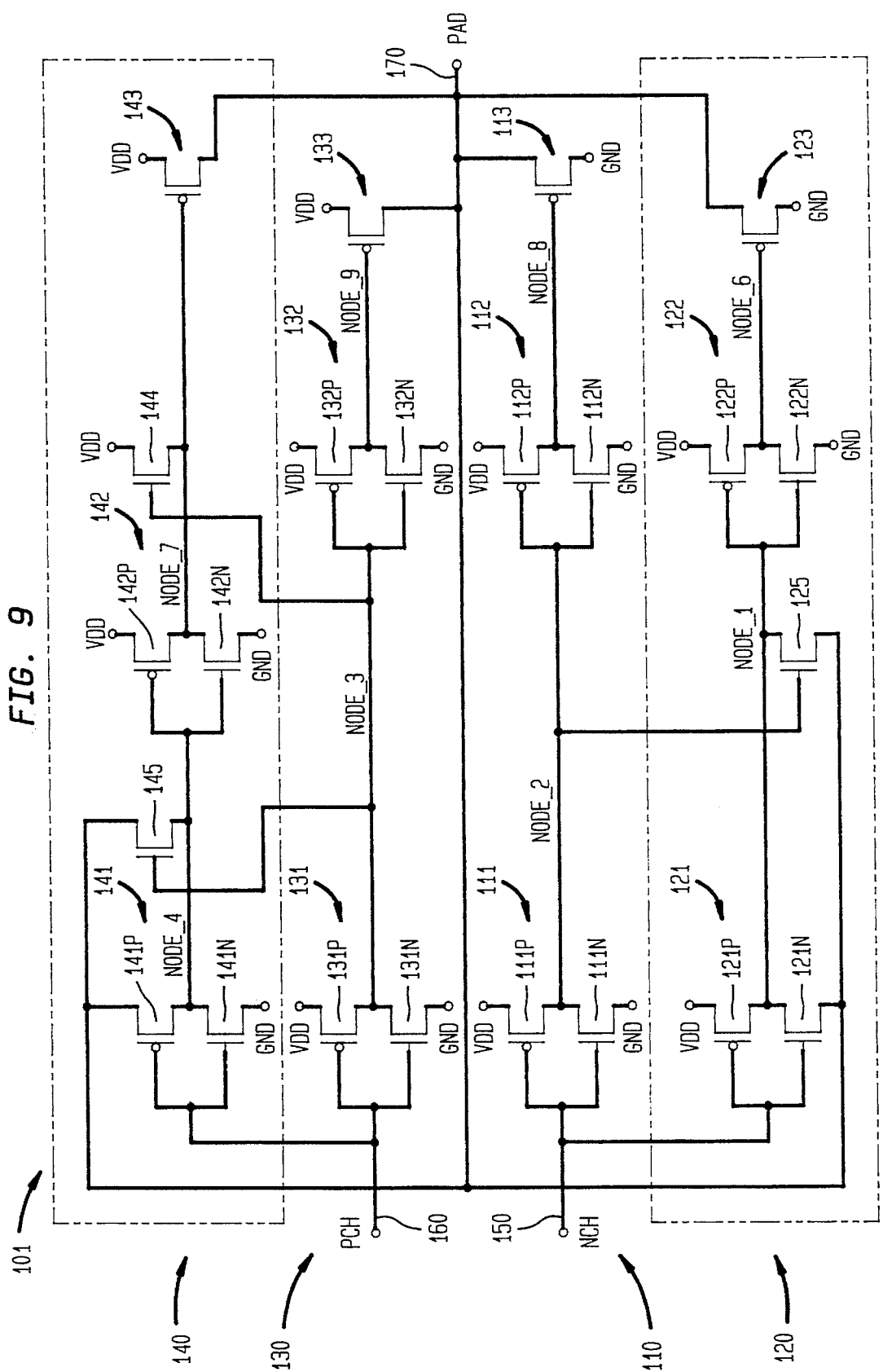
FIG. 9 depicts an output buffer circuit according to a second embodiment of the present invention.

FIG. 9 shows an output buffer circuit 101 according to a second illustrative embodiment of the present invention. Corresponding elements in FIG. 8 and FIG. 9 have the same identifying numerals. The N-channel feedback circuit 120 of the output buffer circuit 101 has an additional active element in the form of a P-MOS transistor 125. The source of the transistor 125 is connected to the output pad 170. The drain of the transistor 125 is connected to the node 1 and the gate of the transistor 125 is connected to the node 2 at the output of inverter 111.

The P-channel feedback circuit 140 of the output buffer circuit 101 has an additional active element in the form of an N-MOS transistor 145. The source of the transistor 145 is connected to the output pad 170. The drain of the transistor 145 is connected to the node 4 and the gate of the transistor 145 is connected to the node 3 at the output of inverter 131.

In addition, the P-channel feedback circuit 140 of the output buffer circuit 101 is provided with a P-channel transistor 144. The source of the transistor 144 is connected to VDD. The drain of the transistor 144 is connected to the node 7 and the gate of the transistor 144 is connected to the node 3.

It may be difficult to design an inverter 121 of the N-channel feedback circuit 120 capable of outputting a voltage on the node 1 that follows the output pad voltage throughout the entire voltage supply range from the positive reference voltage (VDD) to the negative reference voltage (ground). In such a case, the transistor 125 may be provided to ensure that the node 1 follows the output pad voltage throughout the entire voltage supply range. When a high input logic signal voltage is inputted on the N-channel input 110, the inverter 111 outputs a low voltage on the node 2. This low voltage turns on the transistor 125 which drives the node 1 to the output voltage of the output pad 170.

Likewise, if the inverter 141 of the P-channel feedback circuit 140 cannot follow the output pad voltage throughout the entire voltage supply range, the transistor 145 may be provided. When a low input logic signal voltage is inputted on the P-channel input 130, the inverter 131 outputs a high voltage on the node 3. This high voltage turns on the transistor 145 which drives the node 4 to the output voltage on the output pad 170.

The transistor 144 may also be provided for speeding up the turn off of the transistor 143 when a high input logic signal voltage is applied on the P-channel input 130. When a high input logic signal voltage is inputted on the P-channel input 130, the inverter 131 outputs a low voltage on node 3. The transistor 144 turns on and outputs a high voltage on the node 7. This high voltage shuts off the transistor 143.

Figure 10:
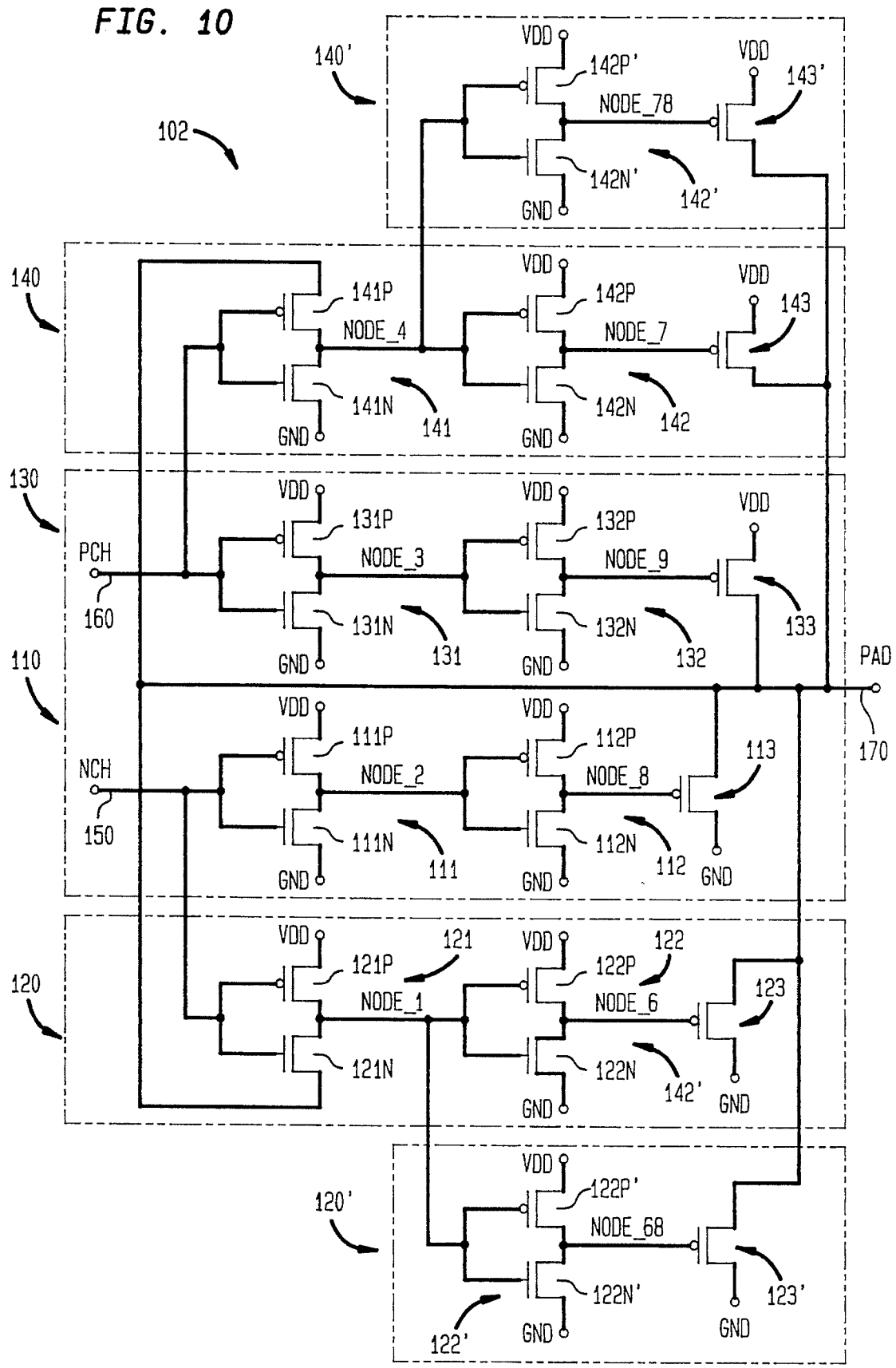
FIG. 10 depicts an output buffer circuit according to a third embodiment of the present invention.

FIG. 10 shows an output buffer circuit 102 according to a third embodiment of the present invention. The output buffer circuit 102 is identical to the output buffer circuit 100 of FIG. 8 except it also includes a second N-channel feedback circuit 120' and a second P-channel feedback circuit 140'.

The second N-channel feedback circuit 120' includes an inverter 122' similar to the inverter 122. The output of the inverter 121 is connected to the input of the inverter 122'. Illustratively, the inverter 122' is a CMOS inverter formed by connecting together the gates and drains of a P-MOS transistor 122P' and an N-MOS transistor 122N'. The source of the P-MOS transistor 122P' serves as a positive reference voltage input of the inverter 122' and is connected to VDD, e.g., via a power supply bus. The source of the N-MOS transistor 122N' serves as a negative reference voltage input. The source of the transistor 122N' receives an inputted negative reference voltage which is ground.

The common gate connection of the transistors 122P' and 122N' serves as the input of the inverter 122' and the common drain connection of the transistors 122N' and 122P' serves as the output of the inverter 122'. When a low voltage appears at the input of the inverter 122', the inverter 122' outputs a high voltage. When a high voltage appears at the input of the inverter 122', the inverter 122' outputs a low voltage. The transistors 122N' and 122P' are illustratively designed so that the inverter 122' does not output a high voltage until the input (i.e., the output pad) voltage drops below a predetermined threshold voltage $V_{te1}'$. Thus, as the voltage inputted to the inverter 122' drops from a high voltage, the output of the inverter 122' remains at a low voltage until the inputted voltage crosses the threshold voltage $V_{te1}'$. Once the input voltage crosses the threshold voltage $V_{te1}'$, the inverter 122' operates in a transition region, i.e., the inverter 122' outputs a high voltage which increases as the inputted (i.e., the output pad) voltage decreases.

The second N-channel feedback circuit 120' also includes a transistor 123' which receives the output of the inverter 122' at a control input of a transistor 123'. Illustratively, the transistor 123' is an N-MOS transistor. The transistor 123' receives the output of the second inverter 122' at its gate. The source of the transistor 123' is connected to the negative reference voltage via the ground bus. The drain of the transistor 123' is connected to the output pad 170. The transistor 123' outputs a large current which is proportional to the voltage applied at its gate. When a low voltage appears at the gate of the transistor 123', the transistor 123' outputs little or no current.

The second P-channel feedback circuit 140' includes an inverter 142' similar to the inverter 142. The output of the inverter 141 is connected to the input of the inverter 142'. Illustratively, the inverter 142' is a CMOS inverter formed by connecting together the gates and drains of a P-MOS transistor 142P' and an N-MOS transistor 142N'. The source of the P-MOS transistor 142P' serves as a positive reference voltage input of the inverter 142' and is connected to VDD, e.g., via a power supply bus. The source of the N-MOS transistor 142N' serves as a negative reference voltage input. The source of the transistor 142N' receives an inputted negative reference voltage which is ground.

The common gate connection of the transistors 142P' and 142N' serves as the input of the inverter 142' and the common drain connection of the transistors 142N' and 142P' serves as the output of the inverter 142'. When a high voltage appears at the input of the inverter 142', the inverter 142' outputs a low voltage. When a low voltage appears at the input of the inverter 142', the inverter 142' outputs a high voltage. The transistors 142N' and 142P' are illustratively designed so that the inverter 142' does not output a low voltage until the input (i.e., the output pad) voltage rises above the predetermined threshold voltage $V_{te2}'$. Thus, as the voltage inputted to the inverter 142' rises from a low voltage, the output of the inverter 142' remains at a high voltage until the inputted voltage crosses the threshold voltage $V_{te2}'$. Once the input voltage crosses the threshold voltage $V_{te2}'$, the inverter 142' operates in a linear mode, i.e., the inverter 142' outputs a low voltage which proportionally decreases as the inputted (i.e., the output pad) voltage increases.

The second P-channel feedback circuit 140' includes a transistor 143' which receives the output of the inverter 142' at a control input of a transistor 143'. Illustratively, the transistor 143' is a P-MOS transistor. The transistor 143' receives the output of the second inverter 142' at its gate. The source of the transistor 143' is connected to the positive reference voltage via the power supply bus. The drain of the transistor 143' is connected to the output pad 170. The transistor 143' outputs a large current which is proportional to the voltage applied at its gate. When a high voltage appears at the gate of the transistor 143', the transistor 143' outputs little or no current.

In operation, when a high input logic signal voltage is inputted on the N-channel input 150, the inverter 121 of the N-channel feedback circuit 120 outputs a voltage on the node 1 which follows the voltage on the output pad 170. Initially, if the output pad voltage is high, or if the output pad 170 is short circuited to a high voltage supply, a high voltage appears on the node 1. So long as the voltage on the node 1 is above the threshold voltage $V_{te1}'$, the inverter 122' of the second N-channel feedback circuit 120' outputs a low voltage on node 6B. Thus, the transistor 123' is in the high impedance state if the output pad voltage is above $V_{te1}'$.

When the output pad voltage falls below $V_{te1}'$, the inverter 122' outputs on node 6B a high voltage which inversely follows the output pad voltage. This high voltage turns on the transistor 123' which supplies a high current. As the output pad voltage falls further below the threshold voltage $V_{te1}'$, the inverter 122' turns the transistor 123' on harder.

Similarly, when a low input logic signal voltage is inputted on the P-channel input 160, the inverter 141 of the P-channel feedback circuit 140 outputs a voltage on the node 4 which follows the voltage on the output pad 170. Initially, if the output pad voltage is low, or if the output pad 170 is short circuited to a low voltage supply, a low voltage appears on the node 4. So long as the voltage on the node 4 is below the threshold voltage $V_{te2}'$, the inverter 142' outputs a high voltage on node 7B. Thus, the transistor 143' is in the high impedance state if the output pad voltage is below $V_{te2}'$.

When the output pad voltage rises above $V_{te2}'$, the inverter 142' of the second P-channel feedback circuit 140' outputs on node 7B a low voltage which inversely follows the output pad voltage. This low voltage turns on the transistor 143' which supplies a high current. As the output pad voltage rises further above the threshold voltage $V_{te2}'$, the inverter 142' turns the transistor 143' on harder.

The advantage in providing several feedback stages 120, 120' or 140, 140' is that smaller current supply transistors 123, 123' or 143, 143' can be provided without changing the performance of the output buffer circuit 102. Thus, in the output buffer circuit 102, the transistors 123 and 123' each need only be large enough to supply half the current of the transistor 123 in the output buffer circuit 100 of FIG. 8. In addition, with multiple feedback circuits 120, 120' and 140, 140' the inverters 122, 122' and 142, 142' are designed so that the corresponding current supply transistors 123' and 143' turn on when the pad voltage is closer to the desired reference voltage than the transistors 123 and 143. In other words the threshold voltages for operation in the transition region are closer to the desired reference voltages for the inverters 122' and 142' than for the inverters 122 and 142.

In summary, a novel output buffer circuit for supplying a high current to an output pad is provided which has an output driver circuit and a feedback circuit. The output driver circuit supplies a relatively small current to an output pad of the output buffer circuit in response to an input logic signal. The feedback circuit has a current supply element for supplying a relatively large current to the output pad. The feedback circuit also has a circuit for generating a feedback voltage for controlling the current supply element in response to an input logic signal. The feedback voltage generating circuit generates a feedback voltage which inversely follows the output pad voltage when the output pad voltage crosses a predetermined threshold. If the output pad is short circuited to a voltage supply which brings the output pad to the other side of the threshold, the feedback circuit turns off the second current supplying element.

Finally, the invention has been described above with reference to illustrative embodiments. Numerous other embodiments may be devised by those having ordinary skill in the art without departing from the spirit and the scope of the following claims.

I claim:

1. An output buffer circuit for supplying a current to an output pad of an integrated circuit comprising:

an output driver circuit including a first current supply element for supplying a first relatively small current to said output pad in response to an input logic signal voltage, and a feedback circuit including a second current supply element for supplying a second relatively large current to said output pad and a circuit for generating a feedback voltage which is responsive to said input logic signal voltage and which inversely follows an output pad voltage after said output pad voltage crosses from a first side to a second side of a predetermined threshold for turning on said second current supply element and for immediately disabling said second current supply element from supplying current when said output pad voltage crosses from said second side to said first side of said threshold.

2. An output buffer circuit for supplying a current to an output pad of an integrated circuit comprising:

an output driver circuit including a first current supply element for supplying a first relatively small current to said output pad in response to an input logic signal voltage, and a feedback circuit including a second current supply element for supplying a second relatively large current to said output pad and a circuit for generating a feedback voltage which is responsive to said input logic signal voltage and which inversely follows an output pad voltage when said output pad voltage crosses a predetermined threshold for turning on said second current supply element, wherein said circuit for generating said feedback voltage comprises a first active element having a control input for receiving said input logic signal voltage, a reference voltage input for receiving said output pad voltage, and an output for generating an output voltage which follows said output pad voltage.

3. The output buffer of claim 2 further comprising an inverter which operates in a transition region when said output pad voltage crosses said threshold, said inverter having an input for receiving said output voltage of said first active element, and an output for outputting said feedback voltage for turning on said second current supply element.

4. The output buffer of claim 3 wherein said first current supply element is a MOS transistor.

5. The output buffer of claim 4 wherein said output driver circuit comprises an input for receiving said input logic signal voltage, a first MOS inverter connected to said input and a second MOS inverter connected in series to said first MOS inverter, said second MOS inverter having an output at which a control voltage for said first current supply element is generated.

6. The output buffer of claim 3 wherein said second current supply element is a MOS transistor.

7. The output buffer of claim 6 wherein said inverter which operates in a transition region is a MOS inverter and wherein said active element of said feedback circuit comprises a MOS inverter.

8. The output buffer of claim 3 further comprising a second active element for insuring that said output of said first active element follows the voltage of said output pad for all voltages in a voltage supply range.

9. The output buffer of claim 2 further comprising at least one additional feedback circuit including a third current supply element for supplying a third relatively large current to said load in response to said output voltage of said first active element.

10. The output buffer of claim 9 wherein said additional feedback circuit comprises a second inverter which operates in a transition region when said pad voltage crosses a threshold for receiving said output voltage of said first active element as an input and for outputting a control voltage for said third current supply element.

11. The output buffer of claim 1 wherein said output driver circuit is an N-channel output driver circuit for discharging said output pad in response to a high input logic signal voltage.

12. The output buffer of claim 11 wherein said feedback circuit is an N-channel feedback circuit for supplying a current to said output pad at a low output pad voltage in response to a high input logic signal voltage.

13. The output buffer of claim 1 wherein said output driver circuit is a P-channel output driver circuit for charging said output pad in response to a low input logic signal voltage.

14. The output buffer of claim 13 wherein said feedback circuit is a P-channel feedback circuit for supplying a current to said output pad at a high output pad voltage in response to a low input logic signal voltage.

15. An output buffer circuit for supplying a current to an output pad of an integrated circuit comprising:

a P-channel output driver circuit including a first current supply element for supplying a first small current for charging said pad in response to a low input logic signal, a P-channel feedback circuit including a second current supply element for supplying a second large current to said output pad at a high value of an output pad voltage, and a circuit for generating a feedback voltage which is responsive to said low input logic signal and which inversely follows said output pad voltage for turning on said second current supply element when said output pad voltage crosses from below to above a first threshold and for immediately disabling said second current supply element from supplying current when said output pad voltage crosses from above to below said first threshold, an N-channel output driver circuit including a current supply element for sinking a third small current for discharging said output pad in response to a high input logic signal, and an N-channel feedback circuit including a fourth current supply element for sinking a fourth large current from said output pad at a low value of said output pad voltage, and a circuit for generating a feedback voltage which is responsive to said high input logic signal and which inversely follows said output pad voltage for turning on said fourth current supply element when said output pad voltage crosses from above to below a second threshold and for immediately disabling said fourth currently supply element from supplying current when said output pad voltage crosses from below to above said second threshold.

16. An output buffer circuit for supplying a current to an output pad of an integrated circuit comprising:

a P-channel output driver circuit including a first current supply element for supplying a first small current for charging said pad in response to a low input logic signal, a P-channel feedback circuit including a second current supply element for supplying a second large current to said output pad at a high value of an output pad voltage, and a circuit for generating a feedback voltage which is responsive to said low input logic signal and which inversely follows said output pad voltage for turning on said second current supply element when said output pad voltage exceeds a first threshold, an N-channel output driver circuit including a current supply element for sinking a third small current for discharging said output pad in response to a high input logic signal, and an N-channel feedback circuit including a fourth current supply element for sinking a fourth large current from said output pad at a low value of said output pad voltage, and a circuit for generating a feedback voltage which is responsive to said high input logic signal and which inversely follows said output pad voltage for turning on said fourth current supply element when said output pad voltage falls below a second threshold, wherein said P-channel feedback circuit further comprises:

an active element responsive to said low input logic signal and having a positive reference voltage which is said output pad voltage and an output voltage which follows said output pad voltage, and an inverter which operates in a transition region when said output pad voltage is above said first threshold, said inverter having an input for receiving said output of said active element of said P-channel feedback circuit and an output for generating said feedback voltage for controlling said second current supply element.

17. An output buffer circuit for supplying a current to an output pad of an integrated circuit comprising:

a P-channel output driver circuit including a first current supply element for supplying a first small current for charging said pad in response to a low input logic signal, a P-channel feedback circuit including a second current supply element for supplying a second large current to said output pad at a high value of an output pad voltage, and a circuit for generating a feedback voltage which is responsive to said low input logic signal and which inversely follows said output pad voltage for turning on said second current supply element when said output pad voltage exceeds a first threshold, an N-channel output driver circuit including a current supply element for sinking a third small current for discharging said output pad in response to a high input logic signal, and an N-channel feedback circuit including a fourth current supply element for sinking a fourth large current from said output pad at a low value of said output pad voltage, and a circuit for generating a feedback voltage which is responsive to said high input logic signal and which inversely follows said output pad voltage for turning on said fourth current supply element when said output pad voltage falls below a second threshold, wherein said N-channel feedback circuit further comprises:

an active element responsive to said high input logic signal and having a negative reference voltage which is said output pad voltage and an output voltage which follows said output pad voltage, and an inverter which operates in a transition region when said output pad voltage is below said second threshold voltage, said inverter having an input for receiving said output of said active element of said N-channel feedback circuit and an output for generating said feedback voltage for controlling said fourth current supply element.

18. An output buffer circuit for supplying a current to an output pad comprising:

a first current supply element for supplying a small current to said output pad to drive said output pad to a reference voltage of a particular polarity, a second current supply element for supplying a large current to said output pad to drive said output pad to said reference voltage, and a short circuit protection circuit comprising means for generating a control voltage for shutting off said second current supply element when said output pad is short circuited to a voltage supply of opposite polarity to said reference voltage, wherein said means for generating a control voltage comprises:

an active element having an input for receiving a input logic signal, a reference voltage input connected to said output pad voltage, and an output which follows said output pad voltage, and an inverter which operates in a transition region when said output pad voltage is inbetween a threshold and said reference voltage and which is off when said output pad voltage is on the opposite side of said threshold from said reference voltage, said inverter having an input for receiving said output voltage of said active element and an output for generating said control voltage for said second current supply element.

* * * * *